US006703644B1

(12) United States Patent
Lell

(10) Patent No.: US 6,703,644 B1
(45) Date of Patent: Mar. 9, 2004

(54) METHOD FOR PRODUCING A SEMICONDUCTOR CONFIGURATION

(75) Inventor: Alfred Lell, Maxhütte-Haidhof (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/272,969

(22) Filed: Mar. 19, 1999

(30) Foreign Application Priority Data

Mar. 19, 1998 (DE) .......................................... 198 12 199

(51) Int. Cl.⁷ ............................................... H01L 27/15
(52) U.S. Cl. ............................ 257/84; 257/514; 372/50
(58) Field of Search .............................. 257/80, 82, 83, 257/84, 93, 96, 97, 509, 544, 85, 594, 514, 517, 522, 550; 372/50

(56) References Cited

U.S. PATENT DOCUMENTS

| 4,614,958 A |   | 9/1986  | Mikami et al. |         |
| 4,762,802 A | * | 8/1988  | Parillo ........................ | 437/24 |
| 4,794,609 A | * | 12/1988 | Hara et al. ................... | 372/50 |
| 5,281,829 A | * | 1/1994  | Chinen ........................ | 257/80 |
| 5,608,233 A |   | 3/1997  | Sahara et al. |         |

FOREIGN PATENT DOCUMENTS

| DE | 42 05 324 A1 | 8/1993  |
| DE | 4205324 A1   | 8/1993  |
| DE | 4318329 A1   | 12/1993 |

OTHER PUBLICATIONS

Published International Application No. 91/18421 (Kwa) dated Nov. 28, 1991.
International Patent Application WO 91/18421 (Kwa), dated Nov. 28, 1991.

* cited by examiner

Primary Examiner—Douglas A. Wille
(74) Attorney, Agent, or Firm—Laurence A. Greenberg; Werner H. Stemer; Gregory L. Mayback

(57) ABSTRACT

In a method for producing a semiconductor configuration that includes at least two semiconductor elements, at least two differently doped surface regions are embodied on the top side of a semiconductor substrate. After that, an active layer structure including a plurality of layers is constructed on each of the surface regions, and each layer structure is associated with one of the semiconductor elements. Whichever are the lowermost electrically conductive layers toward the substrate in the active layer structures are electrically separated from one another.

13 Claims, 1 Drawing Sheet

METHOD FOR PRODUCING A SEMICONDUCTOR CONFIGURATION

BACKGROUND OF THE INVENTION

Field of the Invention

The invention relates to a method for producing a semiconductor configuration that includes at least two semiconductor elements, and to a semiconductor configuration of this kind.

It is already known to produce semiconductor elements, such as optical semiconductor elements, by epitaxially growing a layer structure on an n or p-doped semiconductor substrate. In this process, a plurality of individual components, each with an identical layer structure, is constructed on the semiconductor substrate (wafer); by sawing apart the substrate, these components are then separated into individual component chips. A semiconductor configuration constructed of a plurality of components (such as an optoelectronic transmitter and receiver configuration) is then made by assembling the appropriate component chips.

It is also already known, in the context of CMOS processes, to apply locally n or p-doped surface regions to a semiconductor substrate. The local or regional doping of the semiconductor substrate is attained by ion implantation or thermal doping. The local regions to be doped, such as the source/drain regions of a MOSFET, are defined by a mask applied beforehand.

U.S. Pat. No. 4,614,958 describes an optoelectronic component: that has a light emitter and a light receiver that are installed on the same semiconductor substrate. The lowermost electrically conductive layer, toward the substrate, of the light emitter and of the light receiver communicate electrically with one another via the substrate.

Other component structures that include two or more semiconductor elements electrically communicating with one another via a common semiconductor substrate are described in Published International Patent Application WO 91-18421 A1 and Published, Non-Prosecuted German Patent Application DE 42 05 324 A1.

SUMMARY OF THE INVENTION

It is accordingly an object of the invention to provide a method for producing a semiconductor configuration that overcomes the above-mentioned disadvantages of the prior art methods and devices of this general type, in which a semiconductor configuration is produced economically and includes at least two semiconductor elements.

With the foregoing and other objects in view there is provided, in accordance with the invention, a method for producing a semiconductor configuration having at least two semiconductor elements, which includes: a) furnishing a semiconductor substrate having a top side; b) forming at least two differently doped surface regions on the top side of the semiconductor substrate; and c) constructing at least two active layer structures on the at least two differently doped surface regions, each of the at least two active layer structures having a plurality of layers including a lowermost electrically conductive layer disposed closest toward the semiconductor substrate, the lowermost electrically conductive layer of each of the at least two active layer structures being electrically separated from one another.

By embodying the two differently doped surface regions on the top side of the semiconductor substrate, it is attained that the two active layer structures, one of which is disposed on each of the doped surface regions of the semiconductor substrate, are not electrically short-circuited via the semiconductor substrate as a result of the different doping of the surface regions. This makes it possible to trigger the two layer structures electrically separately and thus to embody semiconductor elements that can be operated independently of one another on one and the same semiconductor substrate.

By the electric decoupling, achieved according to the invention, of the semiconductor elements, even integrated semiconductor configurations with substantially more than two semiconductor elements can be constructed in a simple way. Sawing the semiconductor substrate apart to separate the semiconductor elements, which was previously necessary, and the ensuing assembly step in which the individual semiconductor elements are put together from a plurality of components to make the desired semiconductor configuration can thus be dispensed with.

The term "semiconductor component" used here should be understood in a broad sense. It covers all kinds of single-function semiconductor structures, such as laser diodes, receiver diodes, etc.

The differently doped surface regions on the top side of the semiconductor substrate can be embodied in various ways. In a first embodiment of the method of the invention, the semiconductor substrate is first completely n or p-doped, and the differently doped surface regions are embodied by applying an epitaxial layer to the top side of the semiconductor substrate, simultaneously or subsequently doping the epitaxial layer with a p or n-doping opposite the doping of the semiconductor substrate, and regionally removing the oppositely doped epitaxial layer. The doping of the epitaxial layer can preferably be done by diffusion of dopant atoms from the gas phase or from a dopant layer deposited beforehand, or by thermal doping in the layer deposition. The surface region doped oppositely from the substrate doping is formed in this case by the surface of the additionally applied epitaxial layer.

A second embodiment of the method of the invention is characterized in that the embodiment of the at least two differently doped surface regions is created by redoping one of the surface regions. This embodiment includes depositing a mask layer on the top side of the substrate. Lithographically structuring the mask layer, in such as way that one of the surface regions to be embodied remains covered by the mask layer, while the other surface region to be embodied is bare. Redoping the bare surface region to a p or n-doping opposite the doping of the semiconductor substrate, or to a nonconductive doping; and removing the mask layer.

The step of redoping is preferably done by diffusion of a dopant substance into the bare surface region of the semiconductor substrate. If the redoping creates a p or n-doped surface region opposite from the n or p-doping of the semiconductor substrate, then dopant gases containing As or P can be used, for instance. To produce a nonconductively doped surface region, $H_2$ can be used as the dopant substance.

The second embodiment has the advantage that no additional epitaxial layer has to be deposited onto the surface; instead, the oppositely doped surface region or the nonconductively doped surface region is created directly on the surface of the semiconductor substrate.

In principle the two layer structures can be built up differently by employing photolithographic structuring processes and etching techniques. In a preferred variant embodiment of the invention, however, the two layer structures are grown simultaneously, as a common layer system, on the semiconductor substrate. The ensuing separation of the layer system into the two layer structures is done by a wet and/or dry etching step and/or by sawing. Since different kinds of semiconductor elements often have an identically constructed active layer system (for instance transmission and reception diodes in optocouplers or laser and monitor diodes in glass fiber applications) a component pair electrically separated from one another can be created in this way. Besides the simplicity of production, already mentioned, another substantial advantage of the integrated construction concept of the invention is that the adjustment step of the two or more semiconductor elements that was previously necessary can now be omitted.

The method of the invention has great variability in terms of the number and configuration of the differently doped surface regions and the structuring of the individual active layer structures. In a preferred variant embodiment of the invention, many differently doped surface regions are embodied in the form of a pattern, in particular a checkerboard pattern, on the substrate surface. This makes it possible to produce large-scale integrated semiconductor configurations in which the semiconductor elements are disposed in a line structure or an array structure on the semiconductor substrate.

Other features which are considered as characteristic for the invention are set forth in the appended claims.

Although the invention is illustrated and described herein as embodied in a method for producing a semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
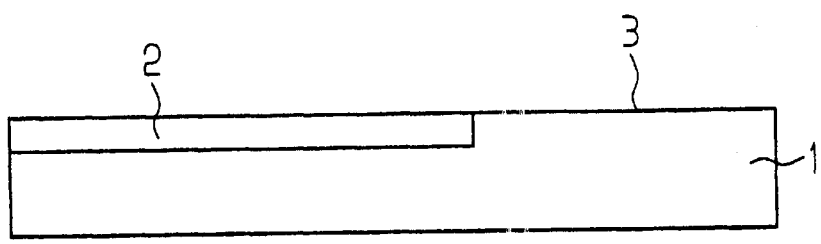
FIG. 1 is a diagrammatic side-elevational view of a semiconductor substrate with a redoped substrate region on a surface according to the invention.

In all the figures of the drawing, sub-features and integral parts that correspond to one another bear the same reference symbol in each case. Referring now to the figures of the drawing in detail and first, particularly, to FIG. 1 thereof, there is shown a method for producing an optical transmitter and receiver configuration on a semiconductor substrate 1 which is supplied by the manufacturer with n-doping and for instance includes GaAs, GaP, InP or SiC. A p-doped surface region 2 is embodied by partial superficial redoping. To that end, in a manner not shown, a diffusion mask of $Al_2O_3$, $SiO_2$, or $Si_3N_4$ is deposited on a top surface of the substrate 1 and then structured by phototechniques in such a way that the surface region 2 is bare. Next, the substrate 1 is exposed to a dopant-containing atmosphere, and the p dopant penetrates into the substrate 1 in the region unprotected by the diffusion mask and thus brings about the redoping of the surface region 2. The intensity of the p redoping can be adjusted as desired by way of the dopant gas concentration and the temperature of the substrate 1. The depth of the redoped surface region 2 is essentially determined by the length of time during which the substrate 1 is exposed to the dopant gas.

On the edges toward the substrate of the redoped surface region 2, a p-n junction forms, which electrically decouples the p-redoped surface region 2 from the masked and still n-doped surface region 3.

In a manner not shown, instead of partial redoping of the n-doped substrate to form a p-conductive surface region, redoping into a nonconductive surface region may also be provided. This can be done by using $H_2$ as the dopant substance, which is incorporated into the bare surface region in the context of an implantation step by using an implantation mask, which is the equivalent of the aforementioned diffusion mask. The $H_2$ doping has the effect that the suitably redoped surface region is electrically nonconductive, which in turn again makes an electrical separation of the layer structures to be made on the surface regions 2, 3 possible.

Then, by an etching step in a manner not shown, the diffusion mask (or implantation mask) over the surface region 3 is removed.

After that optionally after repeated surface cleaning steps, the epitaxial growth of an active semiconductor layer system over the full surface is brought about. The growing can be accomplished by an MOCVD process, in particular MOVPE, an LPE process, an MBE process, or an MOMBE process. First, an n-doped epitaxial layer 4 is applied to the substrate surface. The intensity of the doping of the epitaxial layer 4 can correspond to the intensity of the substrate doping. In the ensuing growing of a p-doped epitaxial layer 5, a p-n junction develops between the n-doped epitaxial layer 4 and the p-doped epitaxial layer 5; this junction represents the active zone 6 of the resultant optical semiconductor elements. Above the p-doped epitaxial layer 5, a $p^+$-doped epitaxial layer 7 with good electrical conductivity, or a metal silicide layer, is deposited; this serves as a connection structure for later electrical contacting of the semiconductor elements.

Figure 2:
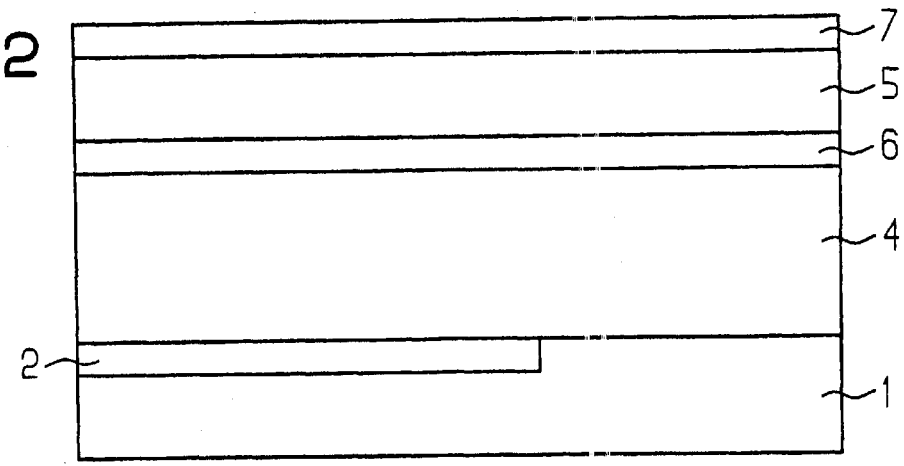
FIG. 2 is a side-elevational view of the semiconductor substrate shown in FIG. 1, with a semiconductor layer system grown epitaxially over its full surface.

The epitaxial layer system 4, 5, 6, 7, grown over the full surface, in FIG. 2 is then separated into two electrically independent layer structures 9 and 10 by making an isolation trench 8. The isolation trench 8 can be made in the layer system 4, 5, 6, 7 by a wet or dry etching step or by scoring the layer system. In the process, all the layers 4, 5, 6 and 7 of the layer system are separated into two partial layers and electrically interrupted. The location of the isolation trench 8 is selected such that the boundary 11 between the two oppositely doped surface regions 2 and 3 is located inside the isolation trench 8. This assures that the lowermost conductive epitaxial layers 4 of the two layer structures 9, 10 are not electrically short-circuited.

In the example shown, the layer structure 9 deposited on the p-doped surface region 2 forms an optical receiver diode 12, while the layer structure 10 applied to the n-doped surface region 3 forms a transmitter diode 13.

The electrical contacting of the receiver diode 12 and transmitter diode 13 can be done as follows.

To embody p-type contacts, respective contact faces 14, 15 are applied to the top surfaces of the $p^+$-doped epitaxial layers 7 of the two layer structures 9, 10. The contact faces 14, 15 include a metal (such as Al, Au, or a three-layer system of Ti—Pt—Au or Cr—Pt—Au) and to which electrical leads can be attached. The contact faces 14, 15 can also have been applied, in the form of a further continuous contacting layer, to the layer system even before the isolation trench 8 is made.

The electrical contacting on the n side is effected, for the receiver diode 12, on a stepped portion of the n-doped epitaxial layer 4, which portion has been bared by an etching process and on which a metal contact face 17 is applied. A corresponding contact face 18 intended for the transmitter diode 13 is disposed on the back surface 19 of the semiconductor substrate 1.

In the event that the transmitter diode 13 is constructed on a nonconductive (for instance, $H_2$-doped) surface region, the contacting of the transmitter diode 13 on the n side is done not on the back surface of the substrate 1 but, analogously to the receiver diode, also on a corresponding stepped portion of the n-doped epitaxial layer 4.

Figure 3:
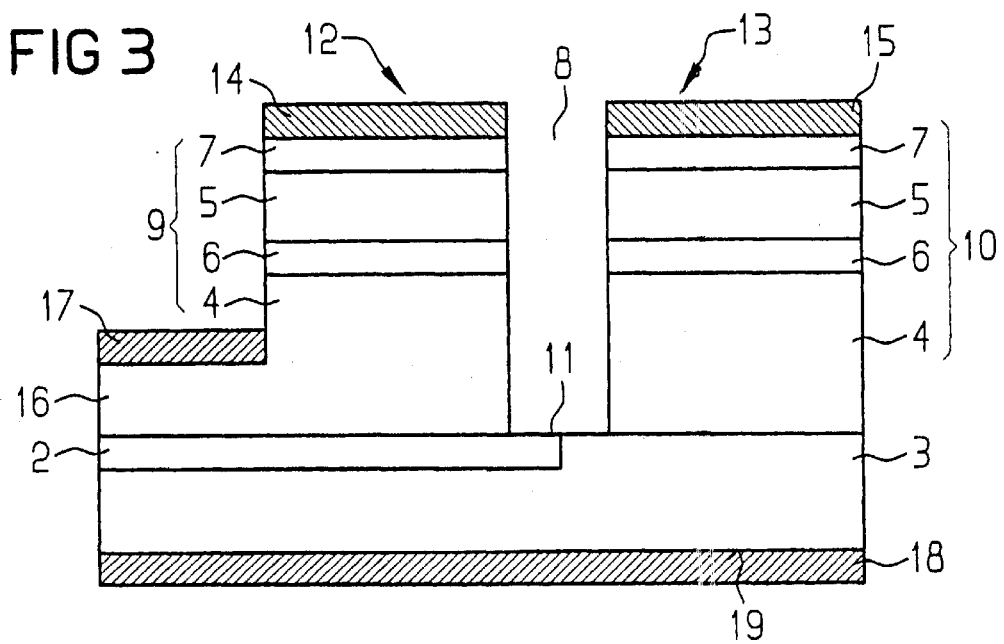
FIG. 3 is a sectional view of a pair of elements formed by the layer system of FIG. 2.

FIG. 3 clearly shows that by the method of the invention, a mutual positional misalignment of the transmitter and receiver diodes 12, 13 is precluded, because their active zones 6 are always located at the same height and extend parallel to one another. Moreover, because of the method of the invention, the diodes 12, 13 can be disposed with a defined, predetermined spacing from one another.

I claim:

1. A semiconductor configuration, comprising:
   at least first and second semiconductor elements;
   a semiconductor substrate having a top side, a first doped region, and a second doped region;
   said first doped region having a first doping type and forming a first doped surface region in said top side of said semiconductor substrate;
   said second doped region having a second doping type opposite said first doping type and forming a second doped surface region in said top side of said semiconductor substrate;
   said first and second doped regions having a boundary region separating said first doped region from said second doped region of said semiconductor substrate;
   each of said first and second semiconductor elements having a configuration of:
      a first layer of said first doping type disposed on said top side of said semiconductor substrate; and
      at least a second layer of said second doping type disposed on said first layer;
   said first layer of said first semiconductor element disposed on said second doped surface region;
   said first layer of said second semiconductor element disposed on said first doped surface region;
   said configurations of said first and second semiconductor elements spaced apart by a trench;
   said boundary region being located inside said trench;
   said first and second semiconductor elements each having first and second contact regions;
   said first contact regions of said first and second semiconductor elements disposed on said second layer;
   said first layer of said first semiconductor element having a surface portion parallel to said top side of said semiconductor substrate;
   said second contact region of said first semiconductor element disposed on said surface portion of said first layer of said first semiconductor element; and
   said second contact region of said second semiconductor element connected to said first doped region of said semiconductor substrate.

2. The semiconductor configuration according to claim 1, wherein one of said first and second semiconductor elements is an optical transmitter diode and another of said first and second semiconductor elements is an optical receiver diode.

3. The semiconductor configuration according to claim 1, wherein said first and second semiconductor elements are two of a plurality of semiconductor elements disposed in a line structure on said semiconductor substrate.

4. The semiconductor configuration according to claim 1, wherein said first and second semiconductor elements are two of a plurality of semiconductor elements disposed in an array structure on said semiconductor substrate.

5. The semiconductor configuration according to claim 1, wherein said first and second layers are epitaxial layers.

6. The semiconductor configuration according to claim 1, wherein:
   said semiconductor substrate has a back side; and
   said second contact region of said second semiconductor element is disposed on said back side.

7. A semiconductor configuration, comprising:
   at least first and second semiconductor elements;
   a semiconductor substrate having a top side, a first doped region, and a second doped region;
   said first doped region having a first doping type and forming a first doped surface region in said top side of said semiconductor substrate;
   said second doped region having a second doped surface region in said top side of said semiconductor substrate, said second doped region being doped to form a non-conductive region;
   said first and second doped regions having a boundary region separating said first doped region from said second doped region of said semiconductor substrate;
   each of said first and second semiconductor elements having a configuration of:
      a first layer of said first doping type disposed on said top side of said semiconductor substrate; and
      at least a second layer of a second doping type opposite said first doping type disposed on said first layer;
   said first layer of said first semiconductor element disposed on said second doped surface region;
   said first layer of said second semiconductor element disposed on said first doped surface region;
   said configurations of said first and second semiconductor elements spaced apart by a trench;
   said boundary region being located inside said trench;
   said first and second semiconductor elements each having first and second contact regions;
   said first contact regions of said first and second semiconductor elements disposed on said second layer;
   said first layer of said first semiconductor element having a surface portion parallel to said top side of said semiconductor substrate;
   said second contact region of said first semiconductor element disposed on said surface portion of said first layer of said first semiconductor element; and
   said second contact region of said second semiconductor element connected to said first doped region of said semiconductor substrate.

8. The semiconductor configuration according to claim 7, wherein said second doped region is doped with $H_2$ to form said non-conductive region.

9. The semiconductor configuration according to claim 7, wherein one of said first and second semiconductor elements is an optical transmitter diode and another of said first and second semiconductor elements is an optical receiver diode.

10. The semiconductor configuration according to claim 7, wherein said first and second semiconductor elements are two of a plurality of semiconductor elements disposed in a line structure on said semiconductor substrate.

11. The semiconductor configuration according to claim 7, wherein said first and second semiconductor elements are two of a plurality of semiconductor elements disposed in an array structure on said semiconductor substrate.

12. The semiconductor configuration according to claim 7, wherein said first and second layers are epitaxial layers.

13. The semiconductor configuration according to claim 7, wherein:

said semiconductor substrate has a back side; and said second contact region of said second semiconductor element is disposed on said back side.

* * * * *